(12) United States Patent
Clothier et al.

(10) Patent No.: US 8,178,008 B2
(45) Date of Patent: May 15, 2012

(54) SEMICONDUCTOR MATERIAL FOR RADIATION ABSORPTION AND DETECTION

(75) Inventors: Brent Allen Clothier, Niskayuna, NY (US); Adrian Ivan, Niskayuna, NY (US); Daniel Bruno McDevitt, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 500 days.

(21) Appl. No.: 12/211,894

(22) Filed: Sep. 17, 2008

(65) Prior Publication Data

US 2010/0065791 A1 Mar. 18, 2010

(51) Int. Cl.
*H01M 4/88* (2006.01)
(52) U.S. Cl. .... 252/518.1; 252/504; 95/35; 250/370.05; 429/231.95
(58) Field of Classification Search .............. 252/518.1, 252/182.1, 504; 250/370.05, 370.12; 95/35; 429/231.95
See application file for complete search history.

(56) References Cited

U.S. PATENT DOCUMENTS

| | | |
|---|---|---|
| 2006/0011854 A1 | 1/2006 | Katagiri |
| 2006/0255282 A1 | 11/2006 | Nikolic et al. |
| 2007/0080301 A1 | 4/2007 | Bell et al. |
| 2008/0044075 A1 | 2/2008 | Gautier et al. |
| 2008/0093557 A1 | 4/2008 | Cooke et al. |
| 2009/0272265 A1* | 11/2009 | Mashimo et al. ............ 95/35 |

FOREIGN PATENT DOCUMENTS

WO 2006085307 8/2006

OTHER PUBLICATIONS

K. Kuriyama et al., "Growth and band gap of the filled tetrahedral semiconductor LiMgN," Journal of Crystal Growth, vol. 237-239, 2002, pp. 2019-2022.

H. Yamane et al., "Ternary nitrides prepared in the Li3N-Mg3N2 System at 900-1000K," Journal of Alloys and Compounds, vol. 319, 2001, pp. 124-130.

T. Moriga et al., "Synthesis of Divalent Metal Nitrides Zn3N2 and Mg3N2 and Enhancement of Their Bandgap by Insertion of Lithium," Processing and Fabrication of Advanced Materials XIII, Proceedings of a Conference Organized by National University of Singapore and Singapore Institute of Manufacturing Technology, Singapore, Dec. 6-8, 2004, pp. 496-507.

K. Kuriyama et al, "Raman scattering from the filled tetrahedral semiconductor LiMgN: Identification of the disordered arrangement between Li and Mg," The American Physical Society, Physical Review B 75, vol. 23, 2007, pp. 233204-1-233204-4.

(Continued)

*Primary Examiner* — Khanh Tuan Nguyen
(74) *Attorney, Agent, or Firm* — Ann M. Agosti

(57) ABSTRACT

A semiconductor material for radiation absorption and detection comprising a composition of stoichiometry $Li(M_1^{2+}, M_2^{2+}, M_3^{2+}, \ldots)(G_1^V, G_2^V, G_3^V, \ldots)$ and exhibiting an antifluorite-type order, where $Li=1$, $(M_1^{2+}+M_2^{2+}+M_3^{2+}+\ldots)=1$, and $(G_1^V+G_2^V+G_3^V+\ldots)=1$. The material provides two useful characteristics: [1] a high Li-site density, which when enriched in $^6Li$, produces exceptional neutron-absorbing capabilities and [2] a semiconducting band-gap for the efficient conversion of absorbed photon and neutron energies into electrical currents. These characteristics can be exploited in applications for power generation or the spectroscopic detection of gamma and neutron radiation. The material can be tailored so as to detect only gamma photons, detect only neutron particles, or simultaneously detect gamma photons and neutron particles.

20 Claims, 2 Drawing Sheets

Ideal Antifluorite Structure $LiM^{2+}G^V$ (Antifluorite-Type)

Li
$M^{2+}$
$G^V$

OTHER PUBLICATIONS

K. Kuriyama et al, "Optical Band Gap of the Ordered Filled-Tetrahedral Semiconductor LiMgP," Solid State Communications, vol. 108, No. 7, 1998, pp. 429-432.

K. Kuriyama et al., "Raman scattering from the ordered filled tetrahedral semiconductor LiMgP," Solid State Communications, vol. 112, 1999, pp. 429-432.

K. Kuriyama et al., "Band edge and phonon-assisted deep level emissions in the ordered filled tetrahedral semiconductor LiMgP," Journal of Applied Physics, vol. 87, No. 5, Mar. 1, 2000, pp. 2303-2306.

K. Kuriyama et al., "Optical band gap of the filled tetrahedral semiconductor LiMgAs," Journal of Applied Physics, American Institute of Physics, vol. 87, No. 6, Mar. 15, 2000, pp. 3168-3170.

K. Kuriyama et al., "Growth and band gap of the filled tetrahedral semiconductor LiZnN," Journal of Crystal Growth, vol. 198/199, 1999, pp. 802-805.

K. Kuriyama et al., "Optical band gap of the filled tatrahedral semiconductor LiZnN," The American Physical Society, Physical Review B, vol. 49, No. 7, Feb. 15, 1994-I, pp. 4511-4513.

K. Kuriyama et al., "Crystal growth and characterization of the filled tetrahedral semiconductor LiZnP," Journal of Crystal Growth, vol. 108, 1991, pp. 37-40.

K. Kuriyama et al., "Optical band gap of the filled tetrahedral semiconductor LiZnP," Rapid Communication, Physical Review B, vol. 37, No. 12, Apr. 15, 1988-II, pp. 7140-7142.

K. Kuriyama et al., "Photoluminescence study of native defects in the filled tetrahedral semiconductor LiZnP," Journal of Applied Physics, American Institute of Physics, vol. 69, No. 11, Jun. 1, 1991, pp. 7812-7814.

K. Kuriyama et al.,"Raman scattering from the filled tetrahedral semiconductor LiZnP," Physical Review B, vol. 47, No. 20, May 15, 1993-II, pp. 13 861-13 863.

K. Kuriyama et al., "Electrical transport properties and crystal structure of LiZnAs," The American Physical Society, Physical Review B, vol. 36, No. 8, Sep. 15, 1987-I, pp. 4439-4441.

K. Kuriyama et al., "Optical band gap of the filled tetrahedral semiconductor LiZnAs," The American Physical Society, Physical Review B, vol. 49, No. 16, Apr. 15, 1994, pp. 11 452-11 455.

K. Kuriyama et al., "Growth and photoluminescence properties of the filled tetrahedral semiconductor LiZnAs," Journal of Crystal Growth, vol. 166, 1996, pp. 631-635.

K. Kuriyama et al., "Raman scattering from the filled tetrahedral semiconductor LiZnAs," The American Physical Society, Physical Review B, vol. 72, 2005, pp. 233201-1-233201-3.

D.M. Wood, "Calculation of the vibrational spectrum of cubic LiZnAs," Physical Review B, he American Physical Society, vol. 71, pp. 193201-1-193201-4.

K. Shah, G. Entine, "Solid-State Neutron Detection with LiZnP", DOE Grant No. DE-FG02-98ER82651 (2009), http://www.science.doe.gov/sbir/awards_abstracts/sbir/cycle16/phase1/intro.htm, Item #108.

A. Bouhemadou et al., "Prediction study of elastic properties under pressure effect for filled tetrahedral semiconductors LiZnN, LiZnP and LiZnAs," Solid State Communications, Science Direct, vol. 141, 2007, pp. 288-291.

A. Walsh et al., "Theoretical study of stability and electronic structure of Li(Mg,Zn)N alloys: A candidate for solid state lighting," The American Physical Society, Physical Review B, vol. 76, 2007, pp. 195208-1-195208-8.

K. Toyoura et al., "First-principles study of defect equilibria in lithium zinc nitride," Journal of Physics Condensed Matter, Institute of Physics Publishing, vol. 19, 2007, pp. 1-11.

W. Honle, "Single-Crystal Structure Refinement of LiZnAs," A Journal of Chemical Sciences, vol. 48b, No. 5, 1993, pp. 683-684.

A. J. Nelson et al., "Synchrotron Radiation Photoemission Study of the Electronic Structure of the Filled Tetrahedral Semiconductors LiZnAs and LiZnP," Journal of Electron Spectroscopy and Related Phenomena, vol. 51, 1990, pp. 623-628.

R. Bacewicz et al., "Preparation and characterization of some AI BII CV type semiconductors," American Institute of Physics, Applied Physics Letters, vol. 52, No. 14, Apr. 4, 1988, pp. 1150-1151.

N. Pereira et al., "The Electrochemistry of Zn3N2 and LiZnN," Journal of the Electrochemical Society, vol. 149, No. 3, 2002, pp. A262-A271.

T. Goto et al., "Formation and control of zinc nitride in a molten LiCl-KCl-L13N system," Materials Science and Engineering A, 2004, vol. 380, pp. 41-45.

K. Toyoura et al., "Structural and Optical Properties of LiZnN Prepared by Electrochemical formation in a LiCl-KCl-Li3N Melt," Journal of the Electrochemical Society, vol. 153, No. 1, 2006, pp. G83-G86.

K. Kuriyama et al., "Preparation and characterization of the filled tetrahedral semiconductor LiZnP film on quartz," Journal of Applied Physics, vol. 66, No. 8, 1989, pp. 3945-3947.

K. Kuriyama et al., "Preparation and characterization of the filled tetrahedral semiconductor LiZnP film on GaP(111)," Journal of Crystal Growth, vol. 113, 1991, pp. 333-335.

K. Kuriyama et al., "Preparation and characterization of the filled tetrahedral semiconductor LiZnP film on InP(111)" Journal of Crystal Growth, vol. 128, 1993, pp. 1125-1129.

D. M. Wood, "Electronic structure of filled tetrahedral semiconductors," Rapid Communications, Physical Review B, vol. 31, No. 4, Feb. 15, 1985, pp. 2570-2573.

A. E. Carlsson, "Electronic structure of LiZnN: Interstitial insertion rule," Rapid Communications, Physical Review B, vol. 32, No. 2, Jul. 15, 1985, pp. 1386-1389.

S. Wei et al., "Electronic Structure and Phase Stability of LiZnAs: A Half Ionic and Half Covalent Tetrahedral Semiconductor," Physical Review Letters, vol. 56, No. 5, Feb. 3, 1986.

L. Hui-Ping et al., "Electronic Structures of the filled Tetrahedral Semiconductor LiMgN with a Zincblende-Type Structure," China Physical Society Letters, vol. 20, No. 1, 2003, pp. 114-116.

L. H. Yu et al., "Electronic structures of filled tetrahedral semiconductors LiMgN and LiZnN: conduction band distortion," Elsevier, Physica B, The American Physical Society, vol. 353, 2004, pp. 278-286.

D.M. Wood, "Calculation of the vibrational spectrum of cubic LiZnAs," Physical Review B, he American Physical Society, vol. 71, pp. 193201-1-193201-4, Feb. 15, 1985.

H. Kandpal et al., "Covalent bonding and the nature of band gaps in some half-Heusler compounds," Journal of Physics D: Applied Physics, vol. 39, 2006, pp. 776-785.

F. Kalarasse et al., "Structural and elastic properties of the filled tetrahedral semiconductors LiZnX (X=-N, P, and As)," Elsevier, Journal of Physics and Chemistry of Solids, vol. 67, 2006, pp. 846-850.

F. Kalarasse et al., Optical properties of the filled tetrahedral semiconductors LiZnX (X=N,P, and As), Elsevier, Journal of Physics and Chemistry of Solids, vol. 67, 2006, pp. 1850-1857.

F. Kalarasse et al., Optical properties of the filled tetrahedral semiconductors LiMgX (X=N,P and As), Journal of Physics: Condensed Matter, Institute of Physics Publishing, vol. 18, 2006, pp. 7237-7247.

L. Kalarasse et al., Pressure effect on the optical properties of the filled tetrahedral semiconductors LiZnX (X=N,P, and As), Journal of Physics and Chemistry of Solids, vol. 68, 2007, pp. 2286-2292.

* cited by examiner

SEMICONDUCTOR MATERIAL FOR RADIATION ABSORPTION AND DETECTION

BACKGROUND OF THE INVENTION

1. Field of the Invention

The invention relates in general to a new semiconductor material for radiation absorption and detection, and in particular, to a semiconductor material based on compositions of $LiM^{2+}G^V$ that exhibit an antifluorite-type ordering, wherein $M^{2+}$ is a divalent metal (or metals) and $G^V$ represents a member (or members) from the Group V elements.

2. Description of the Related Art

Gamma Photon Detection Methods

Traditional approaches to gamma detection involve high-density materials containing elements with large atomic numbers. These materials can be broken into two general classes: [1] scintillators and [2] direct-conversion semiconductors. For both classes, incoming gamma photons interact with the material, depositing energy in the form of energetic primary electrons, which in turn, ionize electron-hole pairs.

In scintillators, a large fraction of these pairs will recombine either directly or at a luminescent site (i.e., an activator dopant or intrinsic defect) to produce photons. Such photon emissions are typically in the visible spectrum. The photons are collected by a photosensor (e.g., photomultiplier tube, photodiode, etc.) and processed by suitable electronics to re-construct the gamma energy spectrum.

In direct-conversion semiconductors, a large fraction of the electron-hole pairs are collected at electrodes via an applied electric field (i.e., electrons migrate to the anode and holes to the cathode). The resulting current pulses are processed by suitable electronics to re-construct the gamma energy spectrum.

Current commercial scintillators include NaI:Tl, CsI:Tl, CsI:Na, $Bi_4Ge_3O_{12}$, (Lu,Y)SiO$_5$:Ce, and LaBr$_3$:Ce. Direct-conversion semiconductors include Si, high-purity Ge, HgI$_2$, PbI$_2$, and members from the $Cd_{1-x}Zn_xTe$ series.

Neutron Particle Detection Methods

Traditional approaches to neutron detection commonly follow one of four available paths: [1] the gaseous containment of $^3$He or $^{10}BF_3$ (e.g., proportional counters, ionization/scintillation chambers), [2] thin layers or doping regions containing either $^{10}$B or $^6$Li atoms on or inside silicon diodes, [3] the solid-state incorporation of $^6$Li in scintillators (e.g., $^6$LiI:Eu or $^6$Li-based, Ce-doped silicate glasses), and [4] hydrogen recoil in organic matter (e.g., anthracene, stilbene, liquid/plastic scintillators).

With the exception of [4], all methods rely on a stable isotope of high neutron cross-section (e.g., $^3$He, $^6$Li, $^{10}$B) to absorb incident neutron radiation. This absorption process induces a nuclear reaction which produces charged heavy particles as by-products:

| | | |
|---|---|---|
| $^3$He(n,p) reaction: | $^3$He + n → $^3$T + $^1$p | Q = 0.764 MeV |
| $^6$Li(n,α) reaction: | $^6$Li + n → $^3$T + $^4$α | Q = 4.78 MeV |
| $^{10}$B(n,α) reaction: | $^{10}$B + n → $^7$Li + $^4$α | Q = 2.792 MeV (Ground State, 6%) |
| | $^{10}$B + n → $^7$Li* + $^4$α | Q = 2.310 MeV (Excited State, 94%) |

The $^{10}$B(n,α) reaction, however, also produces a 0.478 MeV gamma photon when $^7$Li* decays to $^7$Li.

Heavy particle by-products from these neutron capture reactions can be exploited to generate electron-ion pairs in a gas (i.e., [1]) or electron-hole pairs in a solid-state material (i.e., [2] or [3]). Methods [1] and [2] convert such pairs directly into measurable electrical currents, using suitable processing electronics to register the neutron event(s). Method [3] requires, in addition, a photosensor to first convert the photon emissions from the scintillator into electronic pulses.

Method [4] is distinct from [1], [2], and [3] in that it relies on the kinematics of neutron elastic scattering. In this process, incident neutron particles collide with molecularly-bound hydrogen to liberate recoil protons. These recoil protons function in a manner similar to the heavy, charged by-products of the neutron capture reactions above: their energy is transferred to electrons of their host, typically a gas/liquid or polymeric solid. In organic scintillators—the most common embodiment—electron-hole pairs are created which subsequently recombine to generate photons. The photons are collected by a photosensor (e.g., photomultiplier tube, photodiode, etc.) and processed by suitable electronics to register the neutron event.

The first class of neutron detectors (i.e., [1]) represents the dominant and most mature technology sold commercially. The second class of neutron detectors (i.e., [2]) is based on a converter layer of $^6$Li-containing or $^{10}$B-containing material coupled to a silicon diode. This design has evolved from simple planar layers into different 2-D or 3-D variants (e.g., "perforated" silicon, PIN diode pillar elements, etc.) in order to improve neutron sensitivity. Such a trend, however, has come at the expense of increased manufacturing complexity, which in turn, has raised fabrication costs; good production yields have yet to be demonstrated.

The third class of neutron detectors (i.e., [3]) is commercially available as small single crystals (i.e., $^6$LiI:Eu sizes up to 1 inch), and in larger/custom volumes, as amorphous monoliths (i.e., $^6$Li-based, Ce-doped silicate glasses). Unfortunately, the crystals have a non-linear energy response, while the glasses exhibit (in addition) poor light output. As a result, both materials are used only for imaging or counting and not spectroscopy.

The last class of neutron detectors (i.e., [4]) is commercially available in bulk/custom sizes (i.e., solid plastics) or in sealed containers (i.e., liquid organics). These detectors require large volumes of hydrogenous liquid or solid plastic, and as such, their embodiments become sensitized to gamma rays. This latter characteristic necessitates additional, costly pulse-shape electronics to discriminate neutron from gamma events. Another disadvantage is that only the first neutron interaction in the material can be measured. Liquid scintillators are also toxic.

The need to counter loose nuclear weapons threats requires detector systems that can sense concealed and/or shielded radiological materials located on individuals, transported by vehicles, housed within cargo containers, and the like. Furthermore, this detection process must be capable of distinguishing special nuclear materials (e.g., weapons-grade U and Pu, gaseous UF$_6$ for enrichment, etc.) from the presence of medical and industrial radioisotopes, as well as from normally-occurring radioactive material (NORM). Thus, there is a need to provide a material that absorbs gamma and/or neutron radiation, and then converts the energy deposited by this radiation into electrical pulses. These signals can then be processed to create an energy spectrum for each radiation type, thereby enabling radioisotope detection and identification.

BRIEF SUMMARY OF THE INVENTION

In one aspect of the invention, a semiconductor material for radiation absorption and detection comprises a ternary composition of stoichiometry $LiM^{2+}G^V$ and exhibiting an antifluorite-type ordering, where the stoichiometric fractions are Li=1, $M^{2+}$=1, and $G^V$=1, wherein an electron-hole pair is created by absorption of radiation, and the electron-hole pair is detected by generating a current pulse.

In another aspect of the invention, a semiconductor material for radiation absorption and detection comprises a mixed composition of stoichiometry $Li(M_1^{2+}, M_2^{2+}, M_3^{2+}, \ldots)(G_1^V, G_2^V, G_3^V, \ldots)$ and exhibiting an antifluorite-type ordering, where the stoichiometric fractions are Li=1, $(M_1^{2+}+M_2^{2+}+M_3^{2+}+ \ldots)$=1, and $(G_1^V+G_2^V+G_3^V+ \ldots)$=1, wherein an electron-hole pair is created by absorption of radiation, and the electron-hole pair is detected by generating a current pulse.

DETAILED DESCRIPTION OF THE INVENTION

In general, an embodiment of the invention comprises a series of compositions of stoichiometry $LiM^{2+}G^V$ whose atomic constituents exhibit an antifluorite-type ordering. In the embodiment, $M^{2+}$ and $G^V$ refer to, respectively, any divalent metal or Group V pnictogens which together stabilize antifluorite-type ordering. Furthermore, $M^{2+}$ and $G^V$ can be comprised of either individual elements (e.g., end-members) or combinations of elements (e.g., substitutional alloying). For example, LiMgP and LiZnAs are end-members, but Li(Mg,Zn)(As,P) is an alloy. The generic formula is thus: $Li(M_1^{2+}, M_2^{2+}, M_3^{2+}, \ldots)(G_1^V, G_2^V, G_3^V, \ldots)$ where the stoichiometric fractions are Li=1, $M_1^{2+}+M_2^{2+}+M_3^{2+}+\ldots=1$, and $G_1^V+G_2^V+G_3^V+\ldots=1$. For brevity, however, the nomenclature $LiM^{2+}G^V$ will be used with the generic formula presumed.

Examples of $M^{2+}$ include, but are not limited to, the group consisting of: Be, Mg, Ca, Sr, Ba, V, Cr, Mn, Fe, Ru, Os, Cr, Rh, Ir, Ni, Pd, Pt, Cu, Zn, Cd, Hg, Sn, Pb, and combinations thereof. The Group V pnictogens are selected from the group consisting of N, P, As, Sb, Bi, and combinations thereof.

Figure 1:
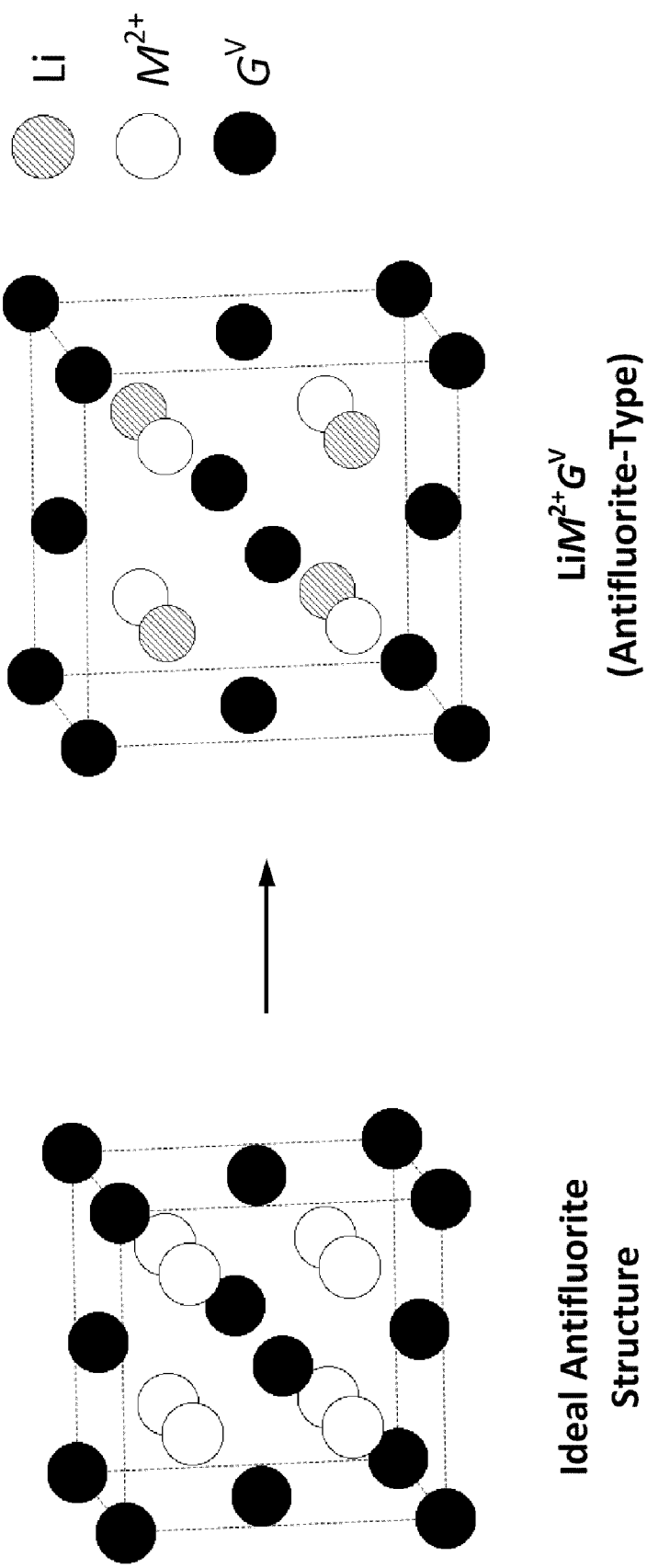
FIG. 1 is pictorial representation of antifluorite-type ordering in $LiM^{2+}G^V$ materials.

Antifluorite-type ordering refers to a face-centered $G^V$ sublattice in which reside tetrahedrally-coordinated Li and $M^{2+}$ constituents. As illustrated in FIG. 1, Li and $M^{2+}$ each coordinate to four nearest $G^V$ neighbors and thus occupy all tetrahedral interstices of the sublattice. Population of these interstices may be statistically random or, as shown in FIG. 1 below, an arrangement of higher symmetry. The $G^V$ sublattice commonly forms a cubic close-packed structure (i.e., a cubic unit cell). Other unit cells (e.g., tetragonal, orthorhombic, etc.), however, are consistent with antifluorite-type ordering provided the aforementioned coordination is preserved.

Antifluorite-type ordering enables two features important to this invention: [1] semiconducting electrical transport via direct band-gap and [2] a high Li-site density. The former alone is important in energy conversion applications (e.g., light emitting diodes, photovoltaic cells, etc.). Both of these characteristics, however, are particularly useful in radiation absorption and detection, especially as applied to radioisotope identification (RII).

Figure 2:
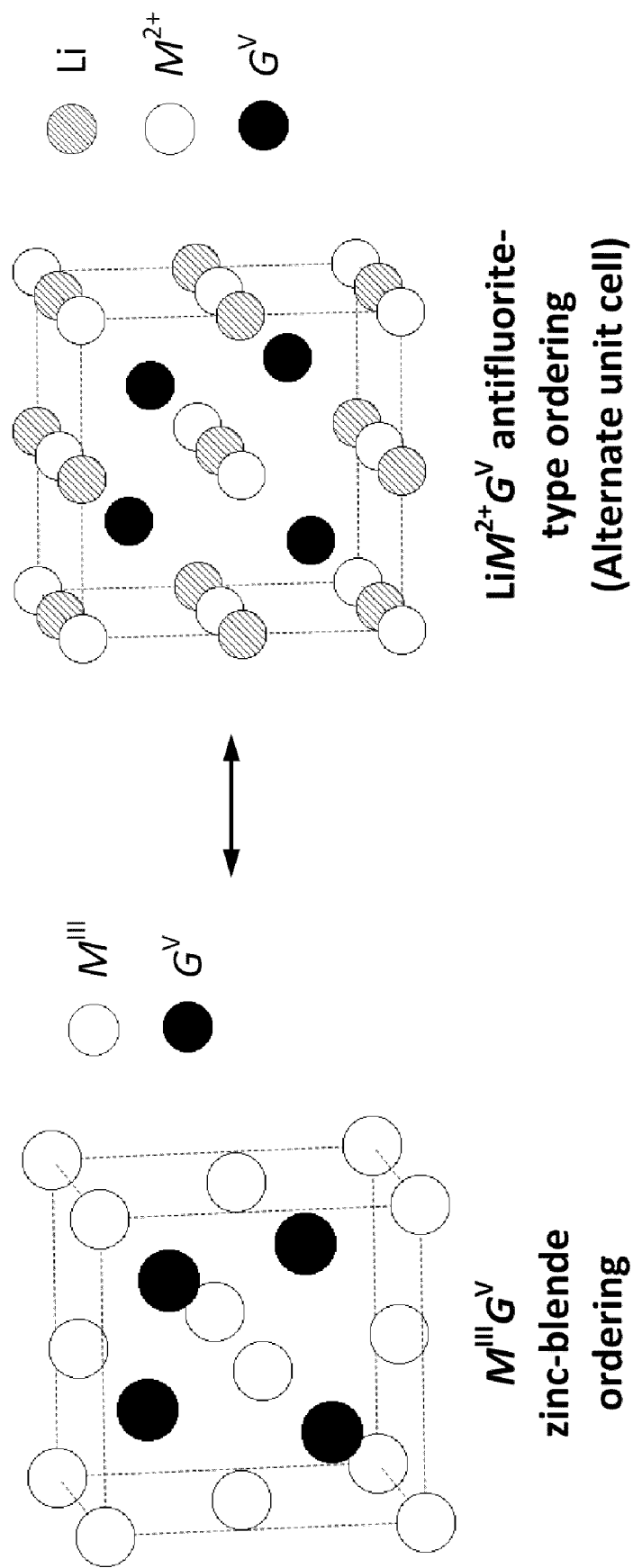
FIG. 2 is pictorial representation of the crystallo-chemical relationship between III-V zinc-blende semiconductors and the $LiM^{2+}G^V$ antifluorite-type materials of the invention.

Antifluorite-type ordering can be related to the zinc-blende structure, a crystalline structure common to many commercial semiconductors. To clarify this relationship, consider the well-known III-V semiconductors which exhibit the zinc-blende crystal basis (e.g., GaAs). Their generic chemical formula can be written as $M^{III}G^V$. If $M^{III}$ is isovalently transmuted into a monovalent and divalent pair (i.e., $M^{III} \rightarrow M^{1+}$ $M^{2+} \rightarrow Li^+ M^{2+}$), chemical neutrality is preserved and a new formula unit is formed: $LiM^{2+}G^V$. The zinc-blende crystal basis, however, must now accommodate two atoms instead of (formerly) one. As shown in FIG. 2, Li occupies all empty octahedral sites of the face-centered $M^{III}$ sublattice while $M^{2+}$ substitutes directly for $M^{III}$. In other words, $Li^+$ occupies all octahedral intertices of the $(M^{2+}G^V)^-$ zinc-blende sublattice. (Note that the alternative unit cell of FIG. 2 is brought into equivalence with the unit cell of FIG. 1 by translating the former +¼, +¼, +¼ in an infinite lattice, all atoms remaining fixed.)

Despite the chemical differences, $LiM^{2+}G^V$ antifluorite-type materials retain the semiconducting behavior of their zinc-blende III-V "siblings". In fact, the presence of small, electropositive $Li^+$ serves to stabilize a direct band gap. The $M^{2+}$-$G^V$ bonds in the $(M^{2+}G^V)^-$ zinc-blende sublattice display notably stronger covalency than that of the $Li^+$-$G^V$ bonds. The latter, on the other hand, exhibit strong ionic character. The resulting $Li^+$-$(M^{2+}G^V)^-$ ionic interaction is sufficient to distort the band structure of the $(M^{2+}G^V)^-$ zinc-blende sublattice, inducing a direct band-gap semiconductor out of an otherwise indirect one. Direct band-gap semiconductors are highly-preferred for radiation absorption and detection because the ionization and recombination of electron-hole pairs proceeds more efficiently via direct transitions.

As shown in TABLE I, the direct band-gap of the $LiM^{2+}G^V$ antifluorite-type materials provides a mechanism to efficiently convert photon energy into electrical energy. Thus, this feature enables applications in photovoltaic cells (i.e., power generation), or with the appropriate electronics for signal analysis, spectroscopic photon detection. The range of applicable photon energies is lower-bounded by the magnitude of the band gap, which in turn, depends on composition.

TABLE I

KNOWN SEMICONDUCTING PROPERTIES FOR SEVERAL $LiM^{2+}G^V$ ANTIFLUORITE-TYPE MATERIALS

| | Band Gap | | | Carriers | | |
|---|---|---|---|---|---|---|
| Composition | Type | Size (eV) | Resistivity (Ω-cm) | Type | $\mu_H$ (cm$^2$/V·s) | Concentration (cm$^{-3}$) |
| M = Mg Series | | | | | | |
| LiMgN | Direct | 3.2 | | | | |
| LiMgP | Direct | 2.43 | | n | 25 | |
| LiMgAs | Direct | 2.29 | | | | |
| M = Zn Series | | | | | | |
| LiZnN | Direct | 1.91 | | p | | |
| LiZnP | Direct | 2.04 | $10^5$-$10^6$ | p | 1-10 | $10^{16}$-$10^{18}$ |
| LiZnAs | Direct | 1.51 | 0.1-1 | p | 16 | $10^{18}$ |
| M = Cd Series | | | | | | |
| LiCdP | Direct | 1.3 | $10^3$-$10^4$ | p | | |
| LiCdAs | | | | | | |
| LiCdSb | | | | | | |

One method of radioisotope identification (RII) stems from gamma photon spectroscopy. The ability to absorb and detect gamma photons, however, improves significantly if elements of large atomic number, Z, are present. The $LiM^{2+}G^V$ antifluorite-type materials are capable of incorporating high-Z, $M^{2+}$ and $G^V$ constituents. The exact choice of constituents is determined by structural stability of the antifluorite-type ordering and the emergence of semiconducting properties amenable to high-sensitivity gamma detection.

In addition to a direct band gap, $LiM^{2+}G^V$ antifluorite-type materials exhibit notable Li-site densities. The corresponding values approach that of the highest Li-bearing materials known. As shown in TABLE II, for example, LiZnN contains about $3.40 \times 10^{22}$ Li-atoms/cm$^3$ versus about $6.12 \times 10^{22}$ Li-atoms/cm$^3$ for LiF and about $4.63 \times 10^{22}$ Li-atoms/cm$^3$ for pure Li metal. This feature is important given the role of $^6$Li in neutron detection. Enrichment of $LiM^{2+}G^V$ antifluorite-type materials in $^6$Li produces bulk semiconductors of exceptional neutron-absorbing capability. Accessibility to thick, highly-efficient neutron-absorption volumes is a key feature (and competitive advantage) of $LiM^{2+}G^V$ antifluorite-type materials.

TABLE II

CRYSTALLOGRAPHIC PROPERTIES FOR SEVERAL $LiM^{2+}G^V$ ANTIFLUORITE-TYPE MATERIALS

| Composition | Structure | Lattice Type | Constant (Å) | Z | $\rho_{Li}$ (atoms/cm$^3$) |
|---|---|---|---|---|---|
| M = Mg Series | | | | | |
| LiMgN | Antifluorite-type | Cubic | 4.955 | 4 | $3.288 \times 10^{22}$ |
| LiMgP | Antifluorite-type | Cubic | 6.005 | 4 | $1.847 \times 10^{22}$ |
| LiMgAs | Antifluorite-type | Cubic | 6.181 | 4 | $1.694 \times 10^{22}$ |
| M = Zn Series | | | | | |
| LiZnN | Antifluorite-type | Cubic | 4.902 | 4 | $3.396 \times 10^{22}$ |
| LiZnP | Antifluorite-type | Cubic | 5.765 | 4 | $2.088 \times 10^{22}$ |
| LiZnAs | Antifluorite-type | Cubic | 5.936 | 4 | $1.912 \times 10^{22}$ |
| M = Cd Series | | | | | |
| LiCdP | Antifluorite-type | Cubic | 6.096 | 4 | $1.766 \times 10^{22}$ |
| LiCdAs | Antifluorite-type | Cubic | 6.262 | 4 | $1.629 \times 10^{22}$ |
| LiCdSb | Antifluorite-type | Cubic | 6.645 | 4 | $1.363 \times 10^{22}$ |

The effectiveness of $LiM^{2+}G^V$ antifluorite-type materials in radiation absorption and detection for radioisotope identification (RII) stems from exploiting both their: [1] semiconducting transport and direct band gap and [2] high Li-site density for $^6$Li enrichment. Creation of electron-hole pairs, either by gamma photons or products of the $^6$Li(n,α) neutron capture reaction, offers a physical mechanism to generate a current pulse for processing by suitable electronics (not shown). These current pulses can be analyzed to construct the energy spectrum of each radiation type.

$LiM^{2+}G^V$ antifluorite-type materials can be doped through compositional modification similar to that practiced with commercial semiconductors. This feature is useful to improve semiconductor transport properties by adjusting carrier concentrations (i.e., electron or hole). For example, a very small excess of Li$^+$ substituted for Zn$^{2+}$ in LiZnN creates a p-type semiconductor with enhanced hole concentration. In general, however, semiconductor doping is achieved by substituting an element which serves as an acceptor or donor relative to a reference constituent element, thus creating a p-type or n-type semiconductor, respectively. Examples in $LiM^{2+}G^V$ antifluorite-type materials include Mg for Li (i.e., donor), Ag for Cd on M$^{2+}$ the site (i.e., acceptor), S for P on the G$^V$ site (i.e., donor), and so forth. A more complete expansion is an acceptor or donor selected from the non-limiting group consisting of Li, Na, K, Rb, Be, Mg, Cu, Ag, Au, B, Al, Ga, In, Sc, Y, C, Si, Ge, Sn, O, S, Se, and Te. Alternatively, vacancy defects can be deliberately introduced with similar effect. Doping concentrations are typically very small, usually less than 0.01% by substitution. These methods are well-known to those skilled in the art and will not be further elaborated here.

In summary, $LiM^{2+}G^V$ antifluorite-type materials provide excellent capabilities for radioisotope identification (RII) by gamma-photon detection only, neutron-particle detection only, or simultaneous gamma-photon and neutron-particle detection. Guidelines for the application of $LiM^{2+}G^V$ antifluorite-type materials are listed below:

Gamma-Photon Detection Only

High-Z, M$^{2+}$ and G$^V$ constituents with negligible neutron capture cross-sections (<0.1 barn for thermal neutrons preferred) can be used. $^6$Li enrichment is unnecessary. If neutron sensitivity must be negligible, deplete Li fully to $^7$Li.

Neutron-Particle Detection Only

Full $^6$Li enrichment is highly-preferred, although concentration can be tailored to the application. If gamma sensitivity must be negligible, select M$^{2+}$ and G$^V$ constituents with minimal Z. To prevent unwanted neutron capture reactions, M$^{2+}$ and G$^V$ constituents should have minimum neutron capture cross-sections (<0.1 barn for thermal neutrons preferred).

Simultaneous Gamma-Photon and Neutron Particle Detection

Select high-Z, M$^{2+}$ and G$^V$ constituents with negligible neutron capture cross-sections (<0.1 barn for thermal neutrons preferred). Full $^6$Li enrichment is highly-preferred, although the concentration can be tailored to the desired range of neutron flux. Simultaneous detection capability requires additional pulse discrimination processing to distinguish between the two possible origins of the signal, i.e., a neutron interaction with $^6$Li atoms or a gamma-photon interaction, most likely with the electrons of the high-Z M$^{2+}$ and G$^V$ constituent atoms. Pulse discrimination can be based on (but not limited to) one of the following methods: [1] pulse amplitude threshold, exploiting the large energy released by the $^6$Li neutron absorption event (i.e., Q=4.78 MeV), as opposed to the typical energy of gamma rays in the application (i.e., below 2 MeV); [2] pulse rise-time method, exploiting the difference in the dynamics of the pair creation by the two types of radiation.

Photon Radiation Absorption for Photovoltaic Applications

Li enrichment or depletion unnecessary (i.e., use natural abundance). Select compositions whose band gaps and carrier properties are optimal for the photon energy range.

The novel $LiM^{2+}G^V$ antifluorite-type semiconductors provide many benefits over conventional radiation absorption and detection materials including:

[1] $LiM^{2+}G^V$ antifluorite-type semiconductors enable the true "bulk" incorporation of a neutron-absorbing isotope, standing in direct contrast to structurally engineered devices with 2D (e.g., thin film or diffused layer) or 3D (e.g., perforated diodes or microcolumnar semiconductor) structures. Accessibility to thick, highly-efficient, neutron absorptive materials that can be easily tailored in volume is a key performance differentiator over the 2D- or 3D-engineered devices, especially for the spectroscopic identification of fast neutrons (>1 MeV).

[2] The utilization of $^6$Li remains an important distinguishing feature compared to existing prior art with $^{10}$B. The $^{10}$B(n,α) neutron capture reaction proceeds via an intermediate excited $^7$Li state, which upon decay, produces 0.478 MeV gamma quanta. This radiation makes $^{10}$B ill-suited for applications requiring spectroscopic detection. Full or partial absorption of the gamma energy by the material host induces large uncertainties in any neutron energy measurement. The $^6$Li(n,α) capture reaction, however, proceeds directly to the reaction-product ground state with no gamma emission.

[3] Of the isotopes well-suited for spectroscopic neutron detection (i.e., $^3$He or $^6$Li), only $^6$Li affords a natural path to solid-state embodiment—an enabling benefit for ultra-compact detectors capable of reliable operation in harsh environments. This distinction remains critical as $^3$He-filled tubes remain the dominant technology for neutron detection. Products based on gaseous neutron detectors suffer from limited energy resolution, sensitivity to vibrations and RF interference, and restrictions in transport and handling due to their classification as pressurized containers.

[4] The $^6$Li(n,α) capture reaction brings two benefits: [1] heavy-particle products (i.e., α and $^3$T) whose short penetration depths (<35 μm) ensure complete energy transfer into a host material and [2] a relatively large 4.78 MeV Q-value compared to 0.764 MeV for $^3$He(n,p). These characteristics, when combined with the direct-conversion mechanism of a solid-state semiconductor, translate into significant performance advantages over $^3$He tubes. For example, because the Q-value of a capture reaction adds to any incident neutron energy (i.e., $E_{neutron}$+4.78 MeV), the higher electronic threshold of +4.78 MeV offers better signal-to-noise ratios and eliminates spurious signals from gamma radiation.

[5] Semiconductor ionization energies (i.e., ~3 eV) are less than those of $^3$He gases (i.e., ~30 eV), and therefore provide improved energy resolution.

[6] LiM$^{2+}$G$^V$ antifluorite-type semiconductors offer the possibility of simultaneously detecting gamma photons and neutron particles. The advantage of such capability becomes apparent when considering that many Special Nuclear Materials (SNM's) present and/or induce both gamma-photon and neutron-particle emission (e.g., weapons-grade Pu or U; gaseous UF$_6$ for enrichment, etc.). Concealment via shielding is more challenging for the neutron component and provides strong motivation for the inclusion of neutron-sensing capabilities in radioisotope identification (RII).

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A semiconductor material for radiation absorption and detection comprising a ternary composition of stoichiometry LiM$^{2+}$G$^V$ and exhibiting an antifluorite-type ordering, where the stoichiometric fractions are Li=1, M$^{2+}$+=1, and G$^V$=1, wherein M$^{2+}$ is selected from the group consisting of Be, Mg, Ca, Sr, Ba, V, Cr, Mn, Fe, Ru, Os, Rh, Ir, Ni, Pd, Pt, Cu, Zn, Cd, Hg, Sn, and Pb, and wherein G$^V$ is selected from the group consisting of N, P, As, Sb, and Bi, and wherein Li consists of $^6$Li, and wherein an electron-hole pair is created by absorption of radiation, and wherein the electron-hole pair is detected by generating a current pulse.

2. The material according to claim 1, wherein M$^{2+}$ and G$^V$ both have a thermal neutron cross-section of less than 0.1 barn.

3. The material according to claim 1, wherein the material absorbs neutrons for generating electrical energy.

4. The material according to claim 1, wherein the material is doped with an element that serves as an acceptor or donor for Li, M$^{2+}$ or G$^V$, thereby creating a p-type or n-type semiconductor.

5. The material according to claim 4, wherein the element that serves as an acceptor or donor is selected from the group consisting of Li, Na, K, Rb, Be, Mg, Cu, Ag, Au, B, Al, Ga, In, Sc, Y, C, Si, Ge, Sn, O, S, Se, and Te.

6. A semiconductor material for radiation absorption and detection comprising a mixed composition of stoichiometry Li(M$_1^{2+}$, M$_2^{2+}$, M$_3^{2+}$, ...)(G$_1^V$, G$_2^V$, G$_3^V$, ...) and exhibiting an antifluorite-type ordering, where the stoichiometric fractions are Li=1, (M$_1^{2+}$+M$_2^{2+}$+M$_3^{2+}$+...)=1, and (G$_1^V$+G$_2^V$+G$_3^V$+...)=1, wherein (M$_1^{2+}$, M$_2^{2+}$, M$_3^{2+}$, ...) is selected from the group consisting of Be, Mg, Ca, Sr, Ba, V, Cr, Mn, Fe, Ru, Os, Rh, Ir, Ni, Pd, Pt, Cu, Zn, Cd, Hg, Sn, and Pb, and combinations thereof, and wherein (G$_1^V$, G$_2^V$, G$_3^V$, ...) is selected from the group consisting of N, P, As, Sb, Bi, and combinations thereof, and wherein Li consists of $^6$Li, and wherein an electron-hole pair is created by absorption of radiation, and wherein the electron-hole pair is detected by generating a current pulse.

7. The material according to claim 6, wherein (M$_1^{2+}$, M$_2^{2+}$, M$_3^{2+}$, ...) and (G$_1^V$, G$_2^V$, G$_3^V$, ...) both have a thermal neutron cross-section of less than 0.1 barn.

8. The material according to claim 6, wherein the material absorbs neutrons for generating electrical energy.

9. The material according to claim 6, wherein the material is doped with an element that serves as an acceptor or donor for Li, (M$_1^{2+}$, M$_2^{2+}$, M$_3^{2+}$, ...) or (G$_1^V$, G$_2^V$, G$_3^V$, ...), thereby creating a p-type or n-type semiconductor.

10. The material according to claim 9, wherein the element that serves as an acceptor or donor is selected from the group consisting of Li, Na, K, Rb, Be, Mg, Cu, Ag, Au, B, Al, Ga, In, Sc, Y, C, Si, Ge, Sn, O, S, Se, and Te.

11. A semiconductor material for radiation absorption and detection comprising a ternary composition of stoichiometry LiM$^{2+}$G$^V$ and exhibiting an antifluorite-type ordering, where the stoichiometric fractions are Li=1, M$^{2+}$=1, and G$^V$=1, wherein M$^{2+}$ is selected from the group consisting of Be, Mg, Ca, Sr, Ba, V, Cr, Mn, Fe, Ru, Os, Rh, Ir, Ni, Pd, Pt, Cu, Zn, Cd, Hg, Sn, and Pb, and wherein G$^V$ is selected from the group consisting of N, P, As, Sb, and Bi, and wherein Li consists of $^6$Li and $^7$Li, and wherein an electron-hole pair is created by absorption of radiation, and wherein the electron-hole pair is detected by generating a current pulse.

12. The material according to claim 11, wherein M$^{2+}$ and G$^V$ both have a thermal neutron cross-section of less than 0.1 barn.

13. The material according to claim 11, wherein the material absorbs both neutrons and photons for generating electrical energy.

14. The material according to claim 11, wherein the material is doped with an element that serves as an acceptor or donor for Li, M$^{2+}$ or G$^V$, thereby creating a p-type or n-type semiconductor.

15. The material according to claim 14, wherein the element that serves as an acceptor or donor is selected from the group consisting of Li, Na, K, Rb, Be, Mg, Cu, Ag, Au, B, Al, Ga, In, Sc, Y, C, Si, Ge, Sn, O, S, Se, and Te.

16. A semiconductor material for radiation absorption and detection comprising a mixed composition of stoichiometry Li(M$_1^{2+}$, M$_2^{2+}$, M$_3^{2+}$, ...)(G$_1^V$, G$_2^V$, G$_3^V$, ...) and exhibiting an antifluorite-type ordering, where the stoichiometric fractions are Li=1, (M$_1^{2+}$+M$_2^{2+}$'M$_3^{2+}$+...)=1, and (G$_1^V$+G$_2^V$+

$G_3^V + \ldots ) = 1$, wherein $(M_1^{2+}, M_2^{2+}, M_3^{2+}, \ldots)$ is selected from the group consisting of Be, Mg, Ca, Sr, Ba, V, Mn, Fe, Ru, Os, Cr, Rh, Ir, Ni, Pd, Pt, Cu, Zn, Cd, Hg, Sn, and Pb, and combinations thereof, and wherein $(G_1^V, G_2^V, G_3^V, \ldots)$ is selected from the group consisting of N, P, As, Sb, Bi, and combinations thereof, and wherein Li consists of $^6$Li and $^7$Li, and wherein an electron-hole pair is created by absorption of radiation, and wherein the electron-hole pair is detected by generating a current pulse.

17. The material according to claim 16, wherein $(M_1^{2+}, M_2^{2+}, M_3^{2+}, \ldots)$ and $(G_1^V, G_2^V, G_3^V, \ldots)$ both have a thermal neutron cross-section of less than 0.1 barn.

18. The material according to claim 16, wherein the material absorbs both neutrons and photons for generating electrical energy.

19. The material according to claim 16, wherein the material is doped with an element that serves as an acceptor or donor for Li, $(M_1^{2+}, M_2^{2+}, M_3^{2+}, \ldots)$ or $(G_1^V, G_2^V, G_3^V, \ldots)$, thereby creating a p-type or n-type semiconductor.

20. The material according to claim 19, wherein the element that serves as an acceptor or donor is selected from the group consisting of Li, Na, K, Rb, Be, Mg, Cu, Ag, Au, B, Al, Ga, In, Sc, Y, C, Si, Ge, Sn, O, S, Se, and Te.

* * * * *